(12) United States Patent
Lee et al.

(10) Patent No.: US 6,881,602 B2
(45) Date of Patent: Apr. 19, 2005

(54) GALLIUM NITRIDE-BASED SEMICONDUCTOR LIGHT EMITTING DEVICE AND METHOD

(75) Inventors: Chia-Ming Lee, Yilan County (TW); Jen-Inn Chyi, Taoyuan County (TW)

(73) Assignee: Tekcore Co., Ltd, Nantou (TW)

( * ) Notice: Subject to any disclaimer, the term of this patent is extended or adjusted under 35 U.S.C. 154(b) by 85 days.

(21) Appl. No.: 10/410,989

(22) Filed: Apr. 8, 2003

(65) Prior Publication Data

US 2003/0211645 A1 Nov. 13, 2003

Related U.S. Application Data

(62) Division of application No. 10/123,287, filed on Apr. 17, 2002, now Pat. No. 6,720,570.

(51) Int. Cl.⁷ .............................. H01L 21/00
(52) U.S. Cl. .................. 438/47; 438/604; 438/685
(58) Field of Search .................. 438/22, 46, 47, 438/604, 683, 685, 933, 956, 979

(56) References Cited

U.S. PATENT DOCUMENTS

| | | | |
|---|---|---|---|
| 6,524,882 B1 * | 2/2003 | Takeya et al. | 438/93 |
| 6,555,403 B1 * | 4/2003 | Domen et al. | 438/22 |
| 6,620,238 B1 * | 9/2003 | Tsuda et al. | 117/90 |

* cited by examiner

*Primary Examiner*—Amir Zarabian
*Assistant Examiner*—Pamela E Perkins
(74) *Attorney, Agent, or Firm*—Baker & McKenzie

(57) ABSTRACT

According to a preferred embodiment of the present invention, there is provided a novel and optimal semiconductor light emitting device comprising a substrate, an n layer disposed co-extensively on the substrate, an $n^{++}$ layer disposed non-extensively and flush on one side of the n layer. Furthermore, a $p^+$ layer is disposed co-extensively on the $n^{++}$ layer of the LED according to the invention, with a p layer further disposed co-extensively on the $p^+$ layer. A p cladding layer is disposed co-extensively on the p layer. A multiple quantum well (MQW) layer is disposed co-extensively on the p cladding layer, and an n cladding layer is further disposed co-extensively on the MQW layer. A second n layer is disposed co-extensively on the n cladding layer. An $n^+$ layer is disposed co-extensively on the second n layer of the LED according to the invention. After partially etching the device, an n electrode is formed opposite $n^{++}$ layer non-extensively on the surface of n layer, and a second n electrode is formed non-extensively (without etching) upon the $n^+$ layer.

16 Claims, 8 Drawing Sheets

GALLIUM NITRIDE-BASED SEMICONDUCTOR LIGHT EMITTING DEVICE AND METHOD

RELATED APPLICATIONS

The present application claims domestic priority to, and is a Division of, U.S. patent application Ser. No. 10/123,287 filed on Apr. 17, 2002, now U.S. Pat. No. 6,720,570 whose content in its entirety is incorporated herein by reference.

FIELD OF THE INVENTION

This invention generally relates to semiconductor light emitting devices, and more particularly to a novel structure for Gallium Nitride (GaN)-based semiconductor devices.

DESCRIPTION OF THE RELATED ART

It has been demonstrated in the art that multiple quantum well (MQW) structures can for optical lattices in which different quantum wells are coherently coupled due to interaction with a retarded electromagnetic field. Light-matter interaction in MQW structures depends on their structure and can be significantly and controllably modified. The III-V nitrides for use with MQW structures have long held promise for optoelectronic applications in the blue and ultraviolet wavelengths and as high-power, high-temperature semiconductors, but only recently have practical devices been developed.

FIG. 1 is a block diagram that schematically illustrates the structure of a Gallium Nitride (GaN)-based III-V compound semiconductor light emitting diode (LED) in the art. The structure 100 has a substrate 101 having an n-GaN layer 102 disposed co-extensively thereupon. An n-type semiconductor is a semiconductor type in which the density of holes in the valence band is exceeded by the density of electrons in the conduction band. N-type behavior is induced by the addition of donor impurities, such as silicon, germanium, selenium, sulfur or tellurium, to the crystal structure of III-V nitrides. A multiple quantum well (MQW) layer 103 is disposed on n-GaN layer 102 flush on one side of n-GaN layer 102 and an n-electrode 104 is disposed non-extensively opposite MQW layer 103 on the surface of n-GaN layer 102. A p-GaN layer 105 is deposited on MQW layer 103 flush therewith and a transparent conductive layer 106 is deposited flush on p-GaN layer 105. A p-type semiconductor is a semiconductor type in which the density of electrons in the conduction band is exceeded by the density of holes in the valence band. P-type behavior is induced by the addition of acceptor impurities, such as beryllium, strontium, barium, zinc or magnesium, to the crystal structure of III-V nitrides. A p-electrode 107 is disposed non-extensively upon transparent conductive layer 106.

FIG. 1A is a block diagram that schematically illustrates the structure of a Gallium Nitride (GaN)-based III-V compound semiconductor laser diode (LD) in the art. The structure 100a includes a substrate 101a having an n-GaN layer 102a disposed co-extensively thereon. An n-cladding layer 108a is disposed on n-GaN layer 102a flush on one side thereof and an n-electrode 104a is disposed non-extensively opposite the n-cladding layer 108a on the surface of the n-GaN layer 102a. A multiple quantum well (MQW) layer is disposed co-extensively on the n-cladding layer 108a. Moreover, a p-cladding layer 106a is disposed co-extensively on the MQW layer 103a. A p-GaN layer 105a is disposed co-extensively on the p-cladding layer 106a. A p-electrode 107a is disposed non-extensively on the p-GaN layer 106a.

In such conventional structures as described in conjunction with FIGS. 1 and 1A, because the p-type III-V nitrides are grown after the MQW, and require a relatively high growing temperature, then in order not to influence the structure and quality of the MQW, the p-GaN growing temperature should not be too high and the growing time should not be too long. In this case, the p-GaN hole concentration, crystal quality, and thickness cannot be improved. Additionally, in LEDs, because p-GaN can absorb light emitted from the MQW, then if the thickness of the p-GaN layer increases, it will adversely influence the effectiveness of light emission. However, if the hole concentration of the p-GaN layer cannot be increased, it will make its sheet resistance extremely high, so when current flows through it, it will tend towards vertical conduction and not the desired horizontal diffusion (current spreading) on the element's surface. When the p-GaN film thickness decreases, this phenomenon will be clearly evident, significantly decreasing the LED's light emitting effectiveness and the light emitting region's size.

Prior art solutions include depositing a thin, transparent metal conducting layer on the p-GaN surface in LEDs and using this conductive layer to make the current spread evenly over the element's surface, thereby increasing the light emitting region and its effectiveness. However, because p-GaN has an extremely high work function, no metal can act in conjunction with it to effectively form a natural ohmic contact. Effective ohmic contact is crucial since the performance of semiconductor devices such as operating voltage is strongly influenced by the contact resistance. Moreover, it is difficult to increase the concentration of p-GaN, and the p-GaN surface is easily contaminated by airborne particles and oxidized. These factors make it difficult to achieve an effective ohmic contact between the p-GaN and a metal conducting layer thereby influencing the electrical properties. There have been other attempts in the art to solve these problems, including utilizing different types of metal layers, surface decontamination, and background gases and heat treatment, but they have all failed to provide a satisfactory ohmic contact. In addition, the transparency between the metal conductive layer and the p-GaN contact in the art cannot reach 100 percent. These and other shortcomings in the art have created a general need for an optimal semiconductor light emitting device structure, and more particularly, a novel and optimal structure for Gallium Nitride (GaN)-based III-V compound semiconductor light emitting devices including LEDs and LDs.

SUMMARY OF THE INVENTION

According to a preferred embodiment of the present invention, there is provided a novel and optimal semiconductor light emitting device comprising a substrate, an n layer disposed co-extensively on the substrate, an $n^{++}$ layer disposed non-extensively and flush on one side of the n layer. Furthermore, a $p^+$ layer is disposed co-extensively on the $n^{++}$ layer of the device according to the invention, with a p layer further disposed co-extensively on the $p^+$ layer. A p cladding layer is disposed co-extensively on the p layer. A multiple quantum well (MQW) layer is disposed co-extensively on the p cladding layer, and an n cladding layer is further disposed co-extensively on the MQW layer. A second n layer is disposed co-extensively on the n cladding layer. An $n^+$ layer is disposed co-extensively on the second n layer of the device according to the invention. After partially etching the device, an n electrode is etched opposite $n^{++}$ layer non-extensively on the surface of n layer, and a second n electrode is formed non-extensively (without etching) upon the $n^+$ layer.

The invention provides a corresponding method for manufacturing a semiconductor light emitting device. This preferred embodiment of the method according to the invention comprises the steps of forming an n layer co-extensively on a substrate, forming an $n^{++}$ layer non-extensively and flush on one side of the n layer, forming a $p^+$ layer co-extensively on the $n^{++}$ layer, forming a p layer co-extensively on the $p^+$ layer, forming a p cladding layer co-extensively on the p layer, forming a multiple quantum well (MQW) layer co-extensively on the p cladding layer, forming an n cladding layer co-extensively on the MQW layer, forming a second n layer co-extensively on the n cladding layer, forming an $n^+$ layer co-extensively on the second n layer, partially etching the light emitting device, forming an n-electrode opposite said $n^{++}$ layer and non-extensively on the n layer, and forming a second n-electrode non-extensively on said $n^+$ layer.

The invention further provides an additional embodiment of a light-emitting diode (LED) according to the invention. The LED according to this particular embodiment includes a sapphire substrate having an n-type GaN layer disposed co-extensively thereupon. An $n^+$ GaN layer is disposed non-extensively and flush with one side of n-type GaN layer. An ohmic contact is formed opposite the $n^+$ GaN layer non-extensively on the surface of the n-GaN layer. A p-type GaN layer is disposed co-extensively with the $n^+$ GaN layer. A multiple quantum well (MQW) layer, made of indium gallium nitride (InGaN) and gallium nitride (GaN), is disposed co-extensively with p-type GaN layer and formed thereupon. Another n-type GaN layer is disposed co-extensively with the MQW layer and formed thereupon. A second ohmic contact is formed non-extensively upon the n-type GaN layer. The ohmic contacts can be formed from titanium (Ti), aluminum (Al) or gold (Au) in a number of multi-layered combinations.

The invention further provides a further embodiment for forming a light-emitting diode (LED) according to the invention. The method according to this particular embodiment of the invention comprises the steps of forming an n-type GaN layer co-extensively on a sapphire substrate, forming an $n^+$ GaN layer non-extensively and flush on one side of the n-type GaN layer, forming a p-type GaN layer co-extensively on the $n^+$ GaN layer, forming a multiple quantum well (MQW) layer (made of InGaN or GaN) co-extensively on the p-type GaN layer, forming a second n-type GaN layer co-extensively on the MQW layer, partially etching the LED, forming an ohmic contact opposite the $n^+$ GaN layer non-extensively on the surface of the n-GaN layer, and forming a second ohmic contact non-extensively on the n-type GaN layer. The ohmic contacts can be formed from titanium (Ti), aluminum (Al) or gold (Au) in a number of multi-layered combinations.

BRIEF DESCRIPTION OF THE DRAWINGS

The preferred and other embodiments of the invention are further described in detail below in conjunction with the accompanying drawings (not necessarily drawn to scale), in which.

DETAILED DESCRIPTION OF THE PREFERRED EMBODIMENTS

Figure 2:
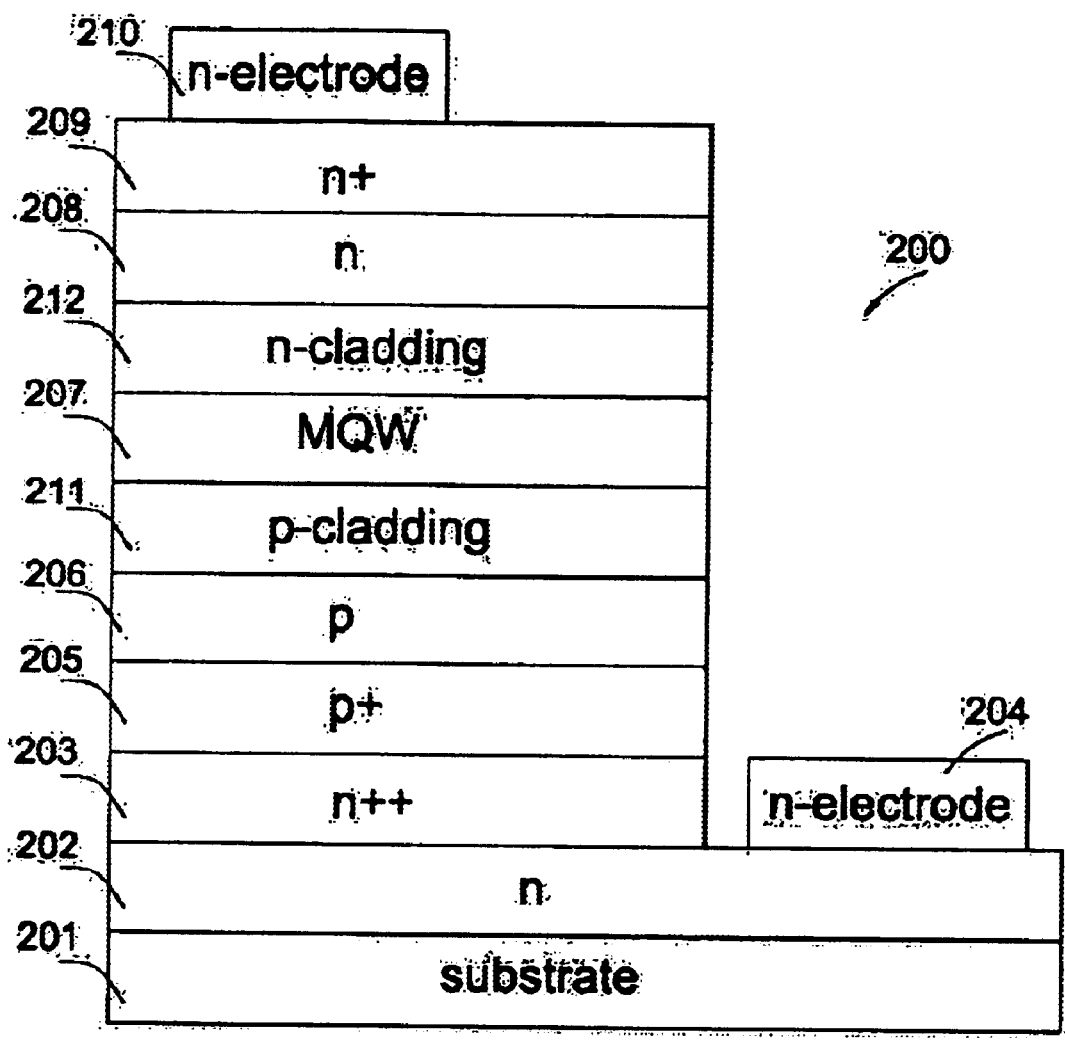
FIG. 2 is a block diagram schematically illustrating a preferred embodiment of the structure of the semiconductor light emitting device according to the invention.

FIG. 2 is a block diagram that schematically illustrates a structure 200 of a light-emitting device (including LEDs and LDs) utilizing a multiple quantum well (MQW) according to a preferred embodiment of the present invention. In the preferred embodiment, the device 200 is composed of GaN-based III-V group compound semiconductors $Al_xIn_yGa_{1-x-y}N$ where $0 \leq x \leq 1$, $0 \leq y \leq 1$, and $0 \leq x+y \leq 1$. Device 200 includes a substrate 201 (such as a sapphire substrate) having an n layer 202 disposed co-extensively thereupon. The n layer 202 is formed by epitaxially growing it on the surface of the substrate 201. Epitaxy or epitaxial growth is the controlled growth of a crystalline layer (namely an epilayer) on a crystalline substrate. An $n^{++}$ layer 203 is disposed non-extensively and flush with one side of n layer 202. The $n^{++}$ layer 203 is formed by epitaxial growth on the surface of the n layer 202. A $p^+$ layer 205 is disposed co-extensively with $n^{++}$ layer 203 and a p layer 206 is disposed co-extensively with $p^+$ layer 205 and thereupon. The $p^+$ layer 205 is formed by epitaxial growth on the surface of the $n^{++}$ layer 203, whereas the p layer 206 is formed by epitaxially growing it on the surface of the $p^+$ layer 205. A p cladding layer 211 is disposed co-extensively on the p layer 206 by epitaxially growing it on the surface thereof. A multiple quantum well (MQW) layer 207 is disposed co-extensively with the p cladding layer 211 and formed thereupon. The MQW layer 207 is formed by epitaxial growth on the surface of the p cladding layer 211. An n cladding layer 212 is formed on the MQW layer 207 by epitaxially growing it on the surface of the n cladding layer 212. Another n layer 208 is disposed co-extensively with the n cladding layer 212 and formed thereupon. The n layer 208 is formed by epitaxially growing it on the surface of the n cladding layer 212. An $n^+$ layer 209 is disposed co-extensively with n layer 208 and thereupon. The $n^+$ layer 209 is formed by epitaxial growth on the surface of the n layer 208. After partially etching the device 200, an n electrode 204 is formed opposite $n^{++}$ layer 203 non-extensively on the surface of n layer 202, and a second n electrode 210 is formed non-extensively (without etching) upon $n^+$ layer 209. Etching is the process of removing material from a semiconductor wafer (such as oxides or other thin films) by chemical, electrolytic or plasma (ion bombardment) means. Each of the layers 202, 203, 205, 206, 207, 208, 209, 211 and 212 is epitaxially grown on the layer immediately below in sequential fashion. The epitaxial growth of the MQW and the upper n-type III-V nitride layers can be performed in an ambient nitrogen gas ($N_2$) or hydrogen gas. The invention advantageously inverts the vertical positions of the p-type and n-type layers and utilizes the n+/p+ tunnel diode junction at the bottom layer for current spreading. A tunneling diode is a heavily doped junction diode that has negative resistance in the forward direction of its operating range. The epitaxial growth temperature of the p-type layer according to the invention is advantageously higher for achieving optimal electrical properties.

Figure 3:
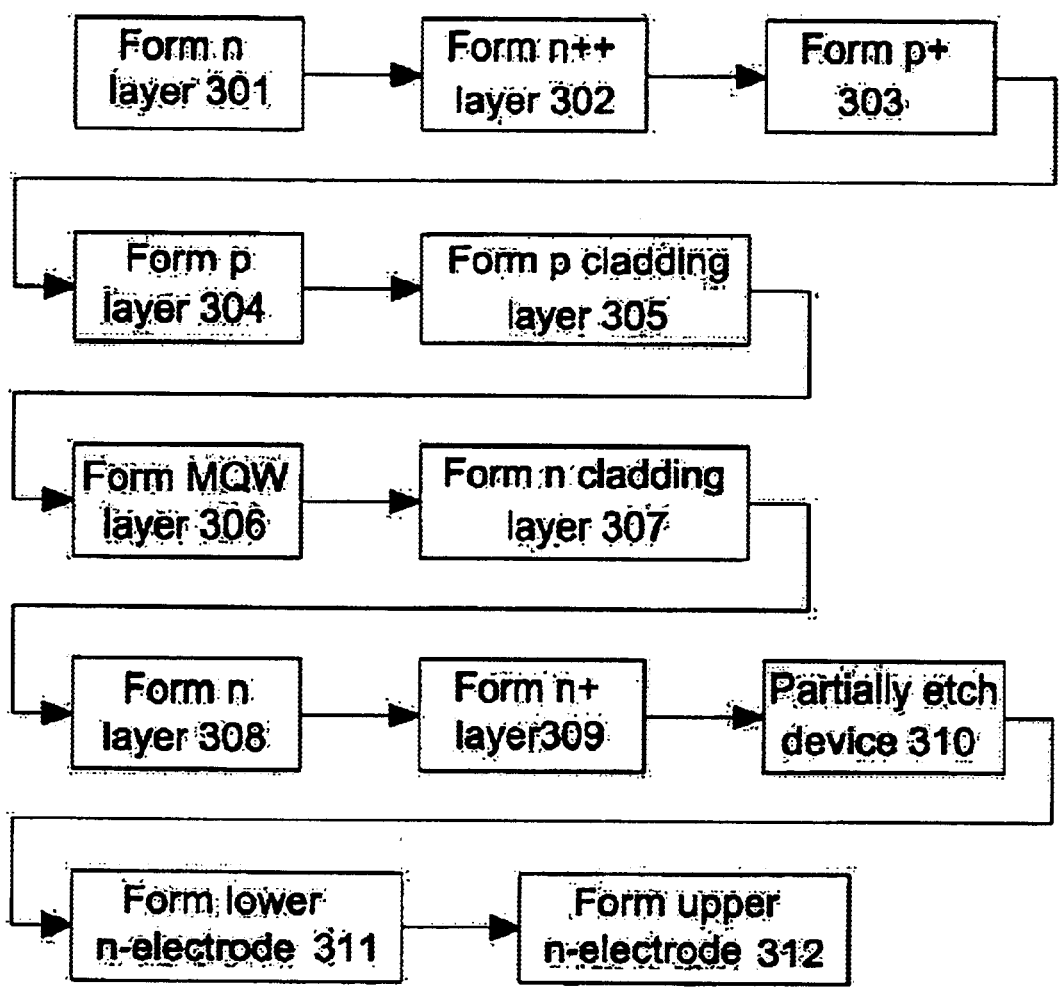
FIG. 3 is a flow diagram schematically illustrating the process steps according to a preferred embodiment of the method according to the invention.

FIG. 3 is a flow diagram that schematically illustrates the process steps according to a preferred embodiment of the method according to the invention. This preferred embodiment of the method according to the invention comprises the steps of forming an n layer 202 co-extensively on a substrate 201 (step 301), forming an $n^{++}$ layer 203 non-extensively and flush on one side of the n layer 202 (step 302), forming a $p^+$ layer 205 co-extensively on the $n^{++}$ layer 203 (step 303), forming a p layer 206 co-extensively on the $p^+$ layer 205 (step 304), forming a p cladding layer 211 co-extensively on the p layer 206 (step 305), forming a multiple quantum well (MQW) layer 207 co-extensively on the p cladding layer 211 (step 306), forming an n cladding layer 212 co-extensively on the MQW layer 207 (step 307), forming another n layer 208 co-extensively on the n cladding layer 212 (step 308), forming an $n^+$ layer 209 co-extensively on the n layer 208 (step 309), partially etching the device 200 (step 310), forming an n electrode 204 opposite the $n^{++}$ layer 203 and non-extensively on the n layer 202 (step 311), and forming (without etching) a second n electrode 210 non-extensively on the $n^+$ layer 209 (step 312). Each of the layers 202, 203, 205, 206, 207, 208, 209, 211 and 212 is epitaxially grown on the layer immediately below in sequential fashion. The epitaxial growth of the MQW and the upper n-type III-V nitride layers can be performed in an ambient nitrogen gas ($N_2$) or hydrogen gas. The n electrode 204 is etched onto the surface of the n layer below to selected depths. In this preferred embodiment, the $n^{++}$ layer 203 provides horizontal current spreading in a generally uniform manner into p-type layers (such as $p^+$ layer 205). Moreover, the $n^{++}$-$p^+$ interface (the $n^{++}$ layer 203 and $p^+$ layer 205 interface) forms a tunneling diode that allows tunneling through that interface. The invention advantageously inverts the vertical positions of the p-type and n-type layers and utilizes the n+/p+ tunnel diode junction at the bottom layer for current spreading. The epitaxial growth temperature of the p-type layer according to the invention is advantageously higher for achieving optimal electrical properties. The device according to the invention does not require a transparent conductive layer as the top electrode when applying to LED elements.

Figure 1:
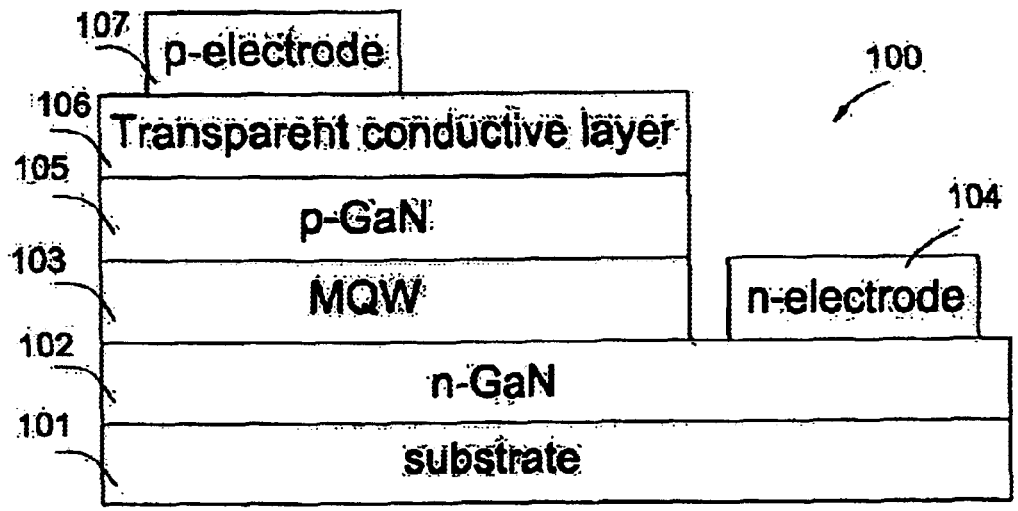
FIGS. 1 and 1A are block diagrams schematically illustrating conventional structures for semiconductor light emitting devices in the art.
Figure 1A:
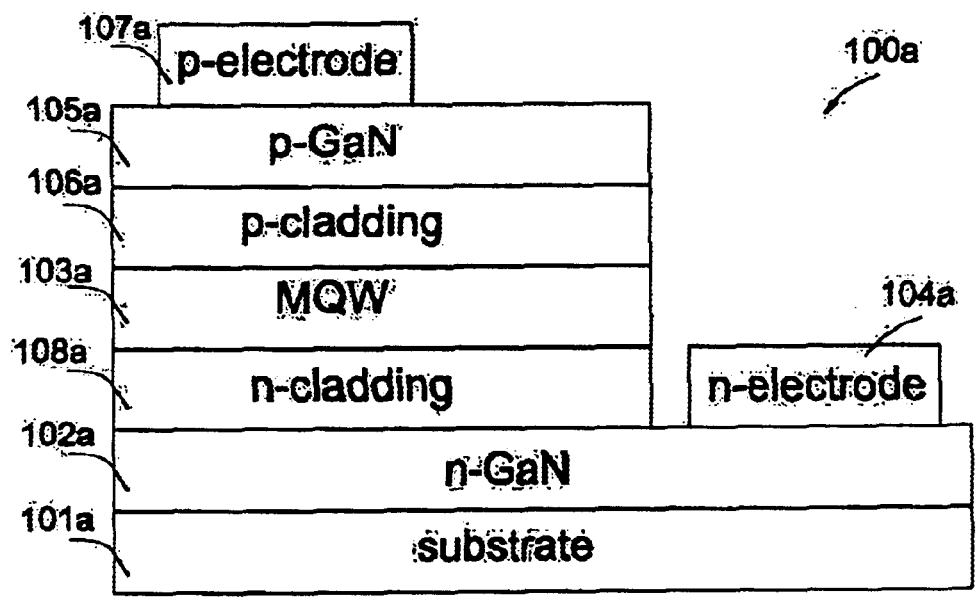
Figure 4:
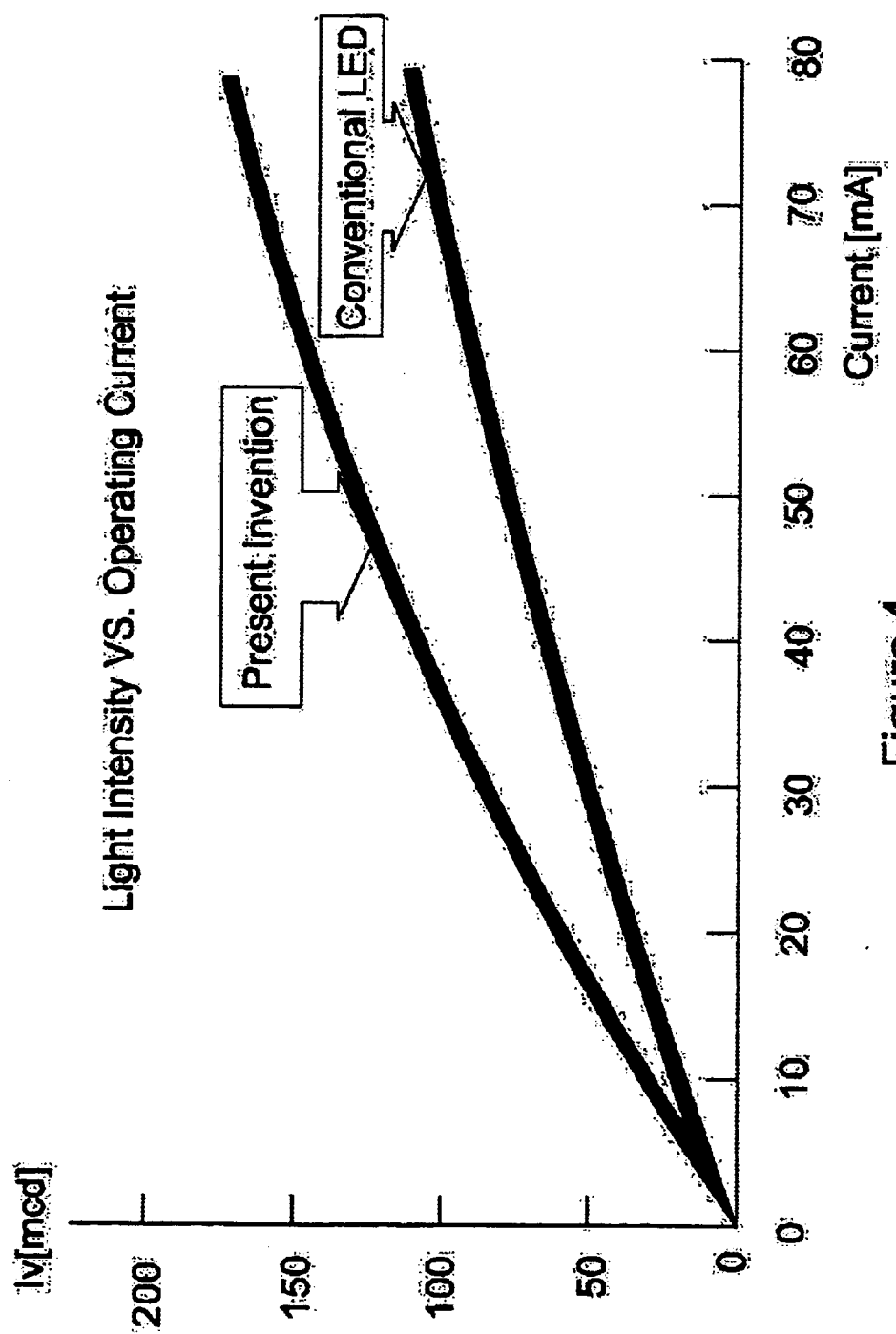
FIG. 4 is a graph of light intensity (ordinate) versus operating current (abscissa) demonstrating the enhanced performance of an LED according to the invention over a conventional LED in the art.

FIG. 4 is a graph of light intensity (ordinate) versus operating current (abscissa) demonstrating the enhanced performance of an LED according to the invention (as shown in FIG. 2) over a conventional LED in the art (as labeled). The LED according the invention advantageously overcomes the aforementioned and other shortcomings of conventional LED structures in the art by having the n-type material on top of the MQW layer and the p-type materials underneath the MQW layer. This novel structure provides the following advantages: (1) The n-type III-V nitrides contact resistance with metal is generally lower that that for p-type III-V nitrides and further provides better ohmic contact. (2) Since growing n-type III-V nitrides does not require extremely high temperatures, its growth after the MQW layer will not then adversely influence the MQW's structure and quality. Moreover, the magnesium (Mg) in the p-type layer will not interdiffuse into the MQW's structure when the growth is under low temperatures. That is, it is known that vacancies occur whenever crystals are grown and lower temperature processing decreases vacancies, in particular, unintentionally doped GaN has been observed to n-type with the best samples showing a compensated electron concentration of approximately $5 \times 10^{16}$ cm$^{-3}$. (3) The distinctive structure of the device according to the present invention allows an increase in the thickness of the p-type III-V nitride layers (such as p layer 206 and $p^+$ layer 205) which will improve the adverse current crowding phenomenon (which is particularly important in LEDs), will not absorb light, and will not influence the structure and quality of the MQW in the devices. (4) The growth temperature of the p-type III-V nitrides can be raised to improve hole concentration and crystal quality, and at the same time not adversely influence the structure and quality of the MQW resulting in improved LED characteristics. In LDs, the crystal quality and carrier concentration are much more important than in LEDs in order to obtain optimal performance characteristics. This is particularly useful in manufacturing green LEDs and LDs because the MQW in green LEDs is grown at relatively low temperatures, which is thus strongly influenced by the following layer's crystal growth temperature. (5) The p-type III-V nitrides light absorption problem in conventional LEDs is solved resulting in higher light emission efficiency (this is particularly applicable to ultraviolet (UV) LEDs since their wavelengths are shorter and thus have greater light energy resulting in greater absorption by the p-layer; with essentially eliminated p-layer absorption, the present invention provides significantly enhanced light-emission efficiency). (6) Since the crystal growth of the MQW and the upper n-type III-V nitride layers can be performed in an ambient nitrogen gas ($N_2$), the growth after the p-type layer can form the "as grown" p-type III-V nitrides layers. Hence, it is not necessary to perform additional procedures for the p-type characteristic. (7) Since it is not necessary to utilize a transparent conductive layer (TCL, such as layer 106 of FIG. 1) in the present invention when applying to LED elements, the light emission efficiency will not be adversely affected (since it is not possible for a TCL to reach 100% in spite of its name, light will be lost by its use), and the conventional trade-off between transparency and electrical characteristic in this case will not have to be done, resulting in increased light emitting efficiency.

Figure 5:
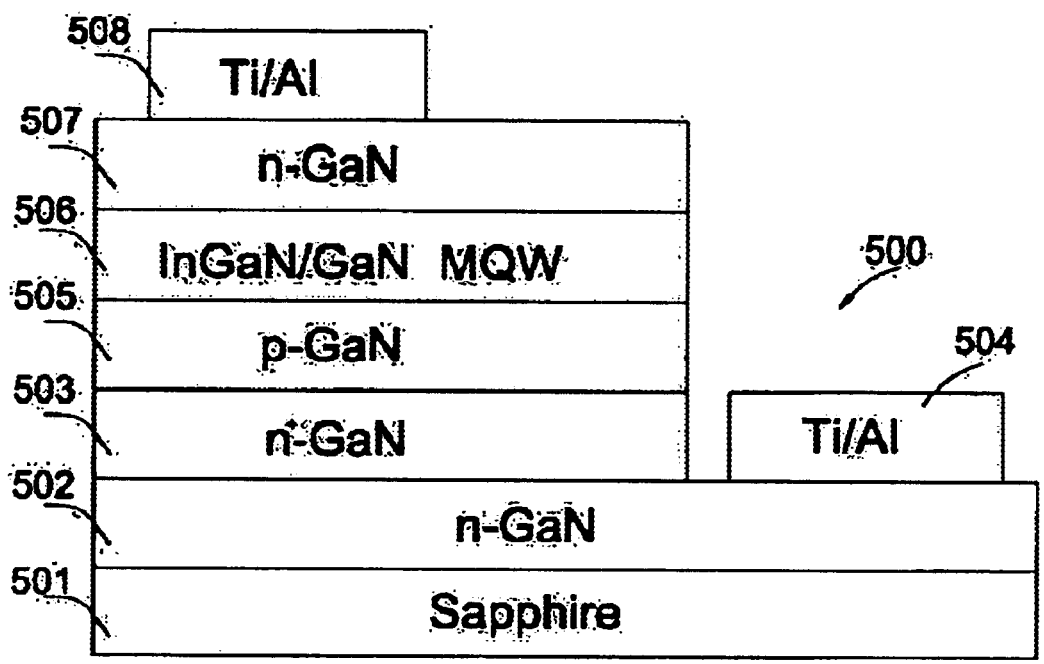
FIG. 5 is a block diagram schematically illustrating an additional embodiment of the structure of the semiconductor LED according to the invention.

FIG. 5 is a block diagram that schematically illustrates an additional embodiment of a light-emitting diode (LED) utilizing a multiple quantum well (MQW) according to a preferred embodiment of the present invention. LED 500 includes a sapphire substrate 501 having an n-type GaN layer 502 disposed co-extensively thereupon. The n-type GaN layer 502 is formed by epitaxially growing it on the surface of the substrate 501. An $n^+$ GaN layer 503 is disposed non-extensively and flush with one side of n-type GaN layer 502. The $n^+$ GaN layer 503 is formed by epitaxial growth on the surface of the n GaN layer 502. A p-type GaN layer 505 is disposed co-extensively with $n^+$ GaN layer 503. The p-type GaN layer 505 is formed by epitaxial growth on the surface of the $n^+$ GaN layer 503. A multiple quantum well (MQW) layer 506, made of indium gallium nitride (InGaN) and gallium nitride (GaN), is disposed co-extensively with p-type GaN layer 505 and formed thereupon, and an n-type GaN layer 507 is disposed co-extensively with the MQW layer 506 and formed thereupon. The MQW layer 506 is formed by epitaxial growth on the surface of the p-type GaN layer 505, while the n-type GaN layer 507 is formed by epitaxially growing it on the surface of the MQW layer 506. After partially etching the LED 500, an ohmic contact 504 is formed opposite n+ GaN layer 503 non-extensively on the surface of n GaN layer 502, and a second ohmic contact 508 is formed non-extensively (without etching) upon the n-type GaN layer 507. The ohmic contacts 504 and 508 can be formed from titanium (Ti), aluminum (Al) or gold (Au) in a number of multi-layered combinations such as Ti/Al, Ti/Au, Ti/Al/Ti/Au, Ti/Al/Au, Al or Au. Each of the layers 502, 503, 505, 506 and 507 is epitaxially grown on the layer immediately below in sequential fashion. The epitaxial growth of the MQW and the upper n-type III-V nitride layers can be performed in an ambient nitrogen gas ($N_2$) or hydrogen gas. The invention advantageously inverts the vertical positions of the p-type and n-type layers and utilizes the n+/p+ tunnel diode junction at the bottom layer for current spreading. The epitaxial growth temperature of the p-type layer according to the invention is advantageously higher for achieving optimal electrical properties. The device according to the invention does not require a transparent conductive layer as the top electrode when applying to LED elements.

The layer structure as particularly shown in FIG. 5 (not drawn to scale) includes of a 3 μm-thick n-type GaN buffer layer 502, 20 nm-thick n+-type GaN layer 503, 1 μm-thick p-type GaN 505, five pairs of $In_xGa_{1-x}N$ well (3 nm) and GaN barrier (10 nm) multiple quantum wells 506, and a 0.3 μm-thick n-type GaN 507. The indium nitride (InN) mole fraction in the InGaN wells is ~0.1 based on the growth calibration curve determined by X-ray diffraction for the LED 500. The ohmic contact 504 is made of Ti—Al (30 nm/500 nm) for the n-type GaN layer 502. The LED 500 has a mesa structure with an area of 300×300 μm².

Figure 6:
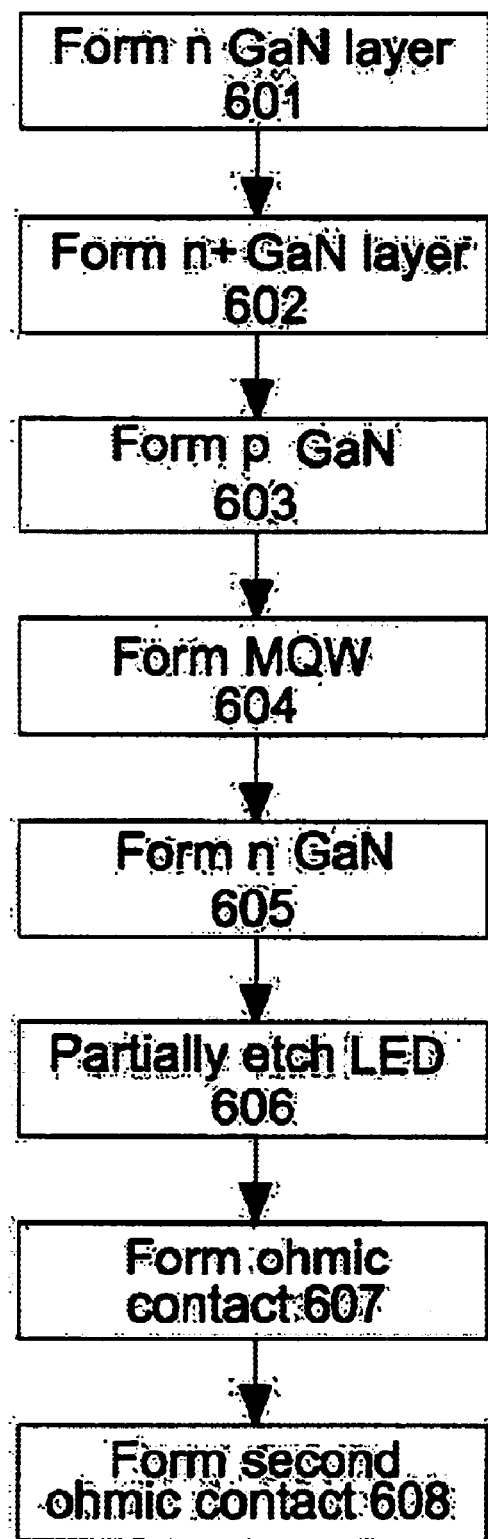
FIG. 6 is a flow diagram schematically illustrating the process steps according to a method corresponding to the embodiment of the method according to the invention as shown in FIG. 5.

FIG. 6 is a flow diagram that schematically illustrates an additional embodiment of the method for making a light-emitting diode (LED 500) according to the embodiment of the invention as shown in FIG. 5. In step 601, an n-type GaN layer 502 is formed on the sapphire substrate 501 and disposed co-extensively thereupon. The n-type GaN layer 502 is formed by epitaxially growing it on the surface of the c-face substrate 501 at the substrate temperature of 460 degrees Celsius (° C.). Moreover, the n-type GaN layer 502 is formed by epitaxially growing it on the surface of the substrate 501 by low-pressure metal-organic chemical vapor deposition. Chemical vapor deposition (or CVD) is a gaseous process that deposits insulating films or metal onto a wafer at elevated temperatures. Reduced pressure is often used to promote the chemical reaction in the CVD process. Ammonia ($NH_3$), trimethylgallium (TMG), trimethylindium (TMI), biscyclopentadienil ($Cp_2Mg$), and silane ($SiH_4$) were used as precursors and dopants. Doping is the intentional introduction of a selected chemical impurity (dopant) into the crystal structure of a semiconductor to modify its electrical properties. For example, adding Silicon (Si) to GaN makes the semiconductor material more n-type. Doping concentrations range from a few parts per billion (for resistive semiconductor regions) to a fraction of a percent (for highly conductive regions).

In step 602, an n+ GaN layer 503 is formed and disposed non-extensively and flush with one side of n-type GaN layer 502. The n+ GaN layer 503 is formed by epitaxial growth on the surface of the n GaN layer 502 at the substrate temperature of 1050° C. In step 603, a p-type GaN layer 505 is formed on n+ GaN layer 503 and disposed co-extensively thereupon. The p-type GaN layer 505 is formed by epitaxial growth on the surface of the n+ GaN layer 503 at the substrate temperature of 1050° C. In step 604, a multiple quantum well (MQW) layer 506, made of indium gallium nitride (InGaN) and gallium nitride (GaN), is disposed co-extensively with p-type GaN layer 505 and formed thereupon. The MQW layer 506 is formed by epitaxial growth on the surface of the p-type GaN layer 505 at the substrate temperature of 720° C. In step 605, an n-type GaN layer 507 is disposed co-extensively with the MQW layer 506 and formed thereupon. The n-type GaN layer 507 is formed by epitaxially growing it on the surface of the MQW layer 506 at the substrate temperature of 950° C. The LED 500 is then partially etched for forming the ohmic contacts (step 606). In step 607, an ohmic contact 504 is formed opposite n+ GaN layer 503 non-extensively on the surface of n-GaN layer 502. In step 608, a second ohmic contact 508 is formed non-extensively upon n-type GaN layer 507. The ohmic contacts 504 and 508 can be formed from titanium (Ti), aluminum (Al) or gold (Au) in a number of multi-layered combinations such as Ti/Al, Ti/Au, Ti/Al/Ti/Au, Ti/Al/Au, Al or Au. Each of the layers 502, 503, 505, 506 and 507 is epitaxially grown on the layer immediately below in sequential fashion. The epitaxial growth of the MQW and the upper n-type III-V nitride layers can be performed in an ambient nitrogen gas ($N_2$) or hydrogen gas. The invention advantageously inverts the vertical positions of the p-type and n-type layers and utilizes the n+/p+ tunnel diode junction at the bottom layer for current spreading. The epitaxial growth temperature of the p-type layer according to the invention is advantageously higher for achieving optimal electrical properties without requiring a transparent conductive layer as the top electrode.

Figure 7:
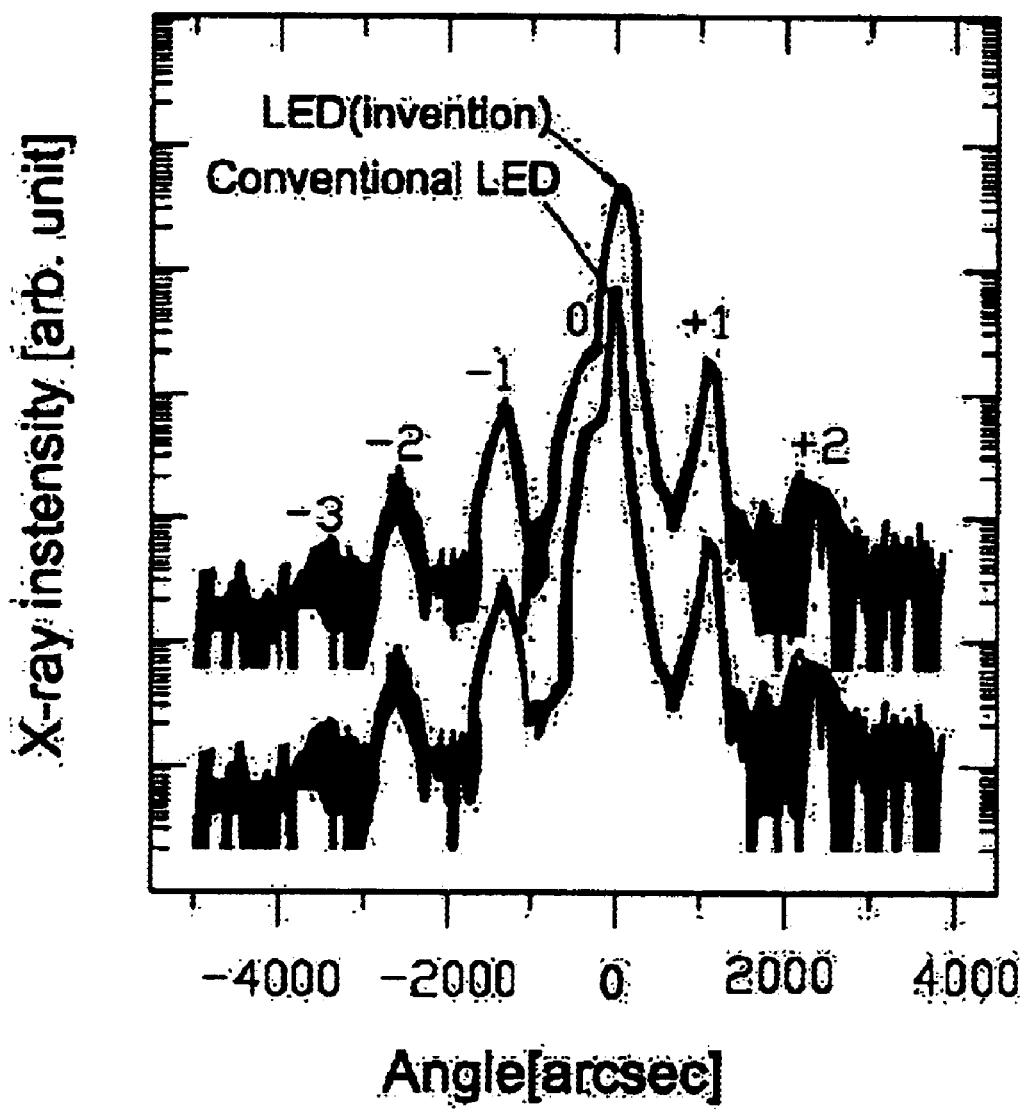
FIG. 7 is a graph of X-ray intensity (ordinate) versus angle (abscissa) illustrating the X-ray rocking curves (XRC) recorded for the reflection of the LED according to the invention as shown in FIG. 5 and a conventional LED in the art.

FIG. 7 is a graph of X-ray intensity (ordinate) versus angle (abscissa) that illustrates the X-ray rocking curves (XRC) recorded for the reflection of the LED 500 according to the invention and a conventional LED in the art. From these X-ray diffraction curves, the −3 to +2 order satellite peaks are distinctly observed. These distinct peaks indicate that the interface of the MQW and the barrier is sufficiently smooth.

Figure 8:
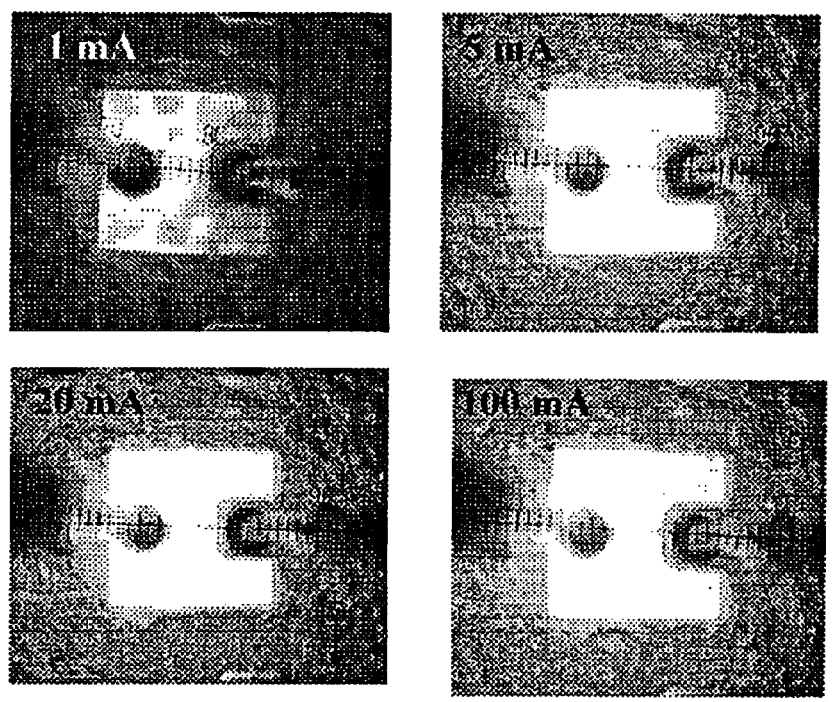
FIG. 8 is a diagram illustrating the luminescent emission images of the embodiment of the LED according to the invention (as shown in FIG. 5) operating in the operating ranges of 5 milliamperes (mA) to 100 mA.

FIG. 8 is a diagram that illustrates the luminescent emission images of the LED 500 according to the invention (as shown in FIG. 5) operating in the operating ranges of 5 milliamperes (mA) to 100 mA, and more particularly, at 1 mA, 5 mA, 20 mA and 100 mA. In particular, the output power (in milliwatts or mW) of the LED 500 operating at an operating current of 20 mA is generally twice the output power of a conventional LED in the art. The total efficiency of the LED 500 and the conventional LED can be calculated by the following equations:

$$I_{ph} = \eta_{Tot} * I/e, \quad (1)$$

$$P_o = I_{ph} * E_{ph}, \quad (2)$$

where $I_{ph}$ represents the photons generated per second, $\eta_{Tot}$ represents the total efficiency of LED. I and e respectively represent the injecting current and the electron charge. $P_o$ is the output optical power of the LED, whereas $E_{ph}$ is the energy of each photon. The peak wavelengths in electroluminescence spectra of both the LED 500 and the conventional LED are around 468 nm. According to these two equations, at an operating current of 20 mA, the total efficiency of the conventional LED versus the LED 500 according to the invention is 9.5% versus 17.0%, respectively. Accordingly, the $\eta_{Tot}$ of the LED 500 according to the invention is generally twice the power output of the conventional LED.

While the above is a full description of the specific embodiments, various modifications, alternative constructions and equivalents may be used. For example, the process steps of the method according to the invention will include methods including substantially the same process steps as the method of the invention to achieve substantially the same result. Therefore, the above description and illustrations should not be taken as limiting the scope of the present invention which is further defined by the appended claims.

We claim:

1. A method for manufacturing a semiconductor light emitting device comprising the steps of:
   forming an n layer co-extensively on a substrate;
   forming an n++ layer non-extensively and flush on one side of said n layer;
   forming a p+ layer co-extensively on said n++ layer;
   forming a p layer co-extensively on said p+ layer;
   forming a p cladding layer co-extensively on said p layer;
   forming a multiple quantum well (MQW) layer co-extensively on said p cladding layer;
   forming an n cladding layer co-extensively on said MQW layer;
   forming a second n layer co-extensively on said n cladding layer;
   forming an n+ layer co-extensively on said second n layer;
   partially etching said device;
   forming an n-electrode opposite said n++ layer and non-extensively on said n layer; and
   forming a second n-electrode non-extensively on said n+ layer.

2. The method of claim 1 wherein said device is made of gallium nitride (GaN) based III-V group compound $Al_xIn_yGa_{1-x-y}N$, wherein $0 \leq x \leq 1$, $0 \leq y \leq 1$, and $0 \leq x+y \leq 1$.

3. The method of claim 1 wherein said n layer, said $n^{++}$ layer, said $p^+$ layer, said p layer, said p cladding layer, said MQW layer, said n cladding layer, said second n layer and said $n^+$ layer are formed by epitaxial growth.

4. The method of claim 3 wherein said epitaxial growth is performed in a gas selected from the group consisting of nitrogen gas and hydrogen gas.

5. The method of claim 1 wherein said MQW layer is made of a compound selected from the group consisting of $Al_{x1}In_{y1}Ga_{1-x1-y1}N$ and $Al_{x2}In_{y2}Ga_{1-x2-y2}N$ wherein $0 \leq x1 \leq 1$, $0 \leq y1 \leq 1$, $0 \leq x1+y1 \leq 1$, $0 \leq x2 \leq 1$, $0 \leq y2 \leq 1$, $0 \leq x2+y2 \leq 1$, $x1 \neq x2$ and $y1 \neq y2$.

6. The method of claim 1 wherein said substrate is one selected from the group consisting of sapphire, SiC, Si, GaAs and GaN.

7. The method of claim 1 wherein said device is one selected from the group consisting of a light emitting diode (LED) and a laser diode (LD).

8. The method of claim 1 wherein said $n^{++}$ layer and said $p^+$ layer forms a tunneling diode.

9. A method for making a semiconductor light emitting diode (LED) comprising the steps of:
   forming a first n-type GaN layer co-extensively on a sapphire substrate;
   forming an $n^+$ GaN layer non-extensively and flush with one side of said first n-type GaN layer;
   forming a p-type GaN layer co-extensively on said $n^+$ GaN layer;
   forming a multiple quantum well (MQW) layer co-extensively with said p-type GaN layer;
   forming a second n-type GaN layer co-extensively on said MQW layer;
   partially etching the stack of layers including said second n-type GaN layer, said MQW layer, said p-type GaN layer and said n+ GaN layer to expose said first n-type GaN layer;
   forming a first ohmic contact opposite said $n^+$ GaN layer non-extensively on said first n-type GaN layer; and
   forming a second ohmic contact non-extensively on said second n-type GaN layer.

10. The method of claim 9 wherein said first ohmic contact is made of an element selected from the group consisting of titanium (Ti), aluminum (Al) and gold (Au).

11. The method of claim 9 wherein said second ohmic contact is made of an element selected from the group consisting of titanium (Ti), aluminum (Al) and gold (Au).

12. The method of claim 9 wherein said first ohmic contact is made of a structure selected from the group consisting of a Ti/Al structure, a Ti/Au structure, a Ti/Al/Ti/Au structure, a Ti/Al/Au structure, an Al structure and an Au structure.

13. The method of claim 9 wherein said second ohmic contact is made of a structure selected from the group consisting of a Ti/Al structure, a Ti/Au structure, a Ti/Al/Ti/Au structure, a Ti/Al/Au structure, an Al structure and an Au structure.

14. The method of claim 9 wherein the LED is made using chemical vapor deposition (CVD).

15. The method of claim 9 wherein said MQW layer is made of a compound selected from the group consisting of indium gallium nitride (InGaN) and gallium nitride (GaN).

16. The method of claim 9 wherein the LED includes material layers made of gallium nitride (GaN) based III-V group compound $Al_xIn_yGa_{1-x-y}N$, wherein $0 \leq x \leq 1$, $0 \leq y \leq 1$, and $0 \leq x+y \leq 1$.

* * * * *